United States Patent
Tanibuchi et al.

(10) Patent No.: US 12,427,581 B2
(45) Date of Patent: Sep. 30, 2025

(54) COATED TOOL

(71) Applicants: KYOCERA CORPORATION, Kyoto (JP); THE UNIVERSITY OF TOKYO, Tokyo (JP)

(72) Inventors: Takahito Tanibuchi, Satsumasendai (JP); Hayato Kubo, Satsumasendai (JP); Yukihiro Shimogaki, Tokyo (JP); Takeshi Momose, Tokyo (JP); Momoko Deura, Tokyo (JP)

(73) Assignees: KYOCERA Corporation, Kyoto (JP); THE UNIVERSITY OF TOKYO, Tokyo (JP)

( * ) Notice: Subject to any disclaimer, the term of this patent is extended or adjusted under 35 U.S.C. 154(b) by 599 days.

(21) Appl. No.: 17/793,675

(22) PCT Filed: Jan. 18, 2021

(86) PCT No.: PCT/JP2021/001478
§ 371 (c)(1),
(2) Date: Jul. 19, 2022

(87) PCT Pub. No.: WO2021/149636
PCT Pub. Date: Jul. 29, 2021

(65) Prior Publication Data
US 2023/0058739 A1    Feb. 23, 2023

(30) Foreign Application Priority Data
Jan. 20, 2020   (JP) .................... 2020-006885

(51) Int. Cl.
*B23B 27/14*       (2006.01)
*C23C 16/34*       (2006.01)

(52) U.S. Cl.
CPC .......... *B23B 27/148* (2013.01); *C23C 16/34* (2013.01); *B23B 2228/105* (2013.01)

(58) Field of Classification Search
None
See application file for complete search history.

(56) References Cited

U.S. PATENT DOCUMENTS

2015/0225840 A1 * 8/2015 Andersson ............ C23C 14/021
                                                  204/192.16
2018/0029144 A1   2/2018 Ono et al.

FOREIGN PATENT DOCUMENTS

JP   2013158868 A   8/2013
WO   2017122448 A1  7/2017

* cited by examiner

Primary Examiner — Seth Dumbris
(74) Attorney, Agent, or Firm — VIERING, JENTSCHURA & PARTNER

(57) ABSTRACT

A coated tool in a non-limiting embodiment of the present disclosure includes a base and a coating film located on the base. The coated tool includes a first surface, a second surface adjacent to the first surface, and a cutting edge located on at least a part of a ridge part of the first surface and the second surface. The coating film includes an AlTiN film including Ti, Al and N. A first Al ratio and a second Al ratio are 0.7 or more. The first Al ratio is Al/(Al+Ti) at a point located 0.1 mm away from the cutting edge, and the second Al ratio is Al/(Al+Ti) at a point located 0.2 mm away from the cutting edge in the first surface. The second Al ratio is larger than the first Al ratio.

3 Claims, 2 Drawing Sheets

COATED TOOL

CROSS-REFERENCE TO RELATED APPLICATIONS

The present application is a national stage entry according to 35 U.S.C. § 371 of PCT Application No. PCT/JP2021/001478 filed Jan. 18, 2021, which claims priority to Japanese Patent Application No. 2020-006885 filed Jan. 20, 2020, which are entirely incorporated herein by reference.

TECHNICAL FIELD

The present disclosure relates to a coated tool.

BACKGROUND

A surface coated cutting tool discussed in, for example, Japanese Unexamined Patent Publication No. 2013-158868 (Patent Document 1) has been known as a coated tool. A hard coating layer composed of a composite nitride layer of Al and Cr is depositedly formed on a surface of a tool base in the surface coated cutting tool (coated tool) discussed in Patent Document 1. The hard coating layer is depositedly formed by arc ion plating method that is one of physical vapor deposition (PVD) methods.

SUMMARY

A coated tool in a non-limiting embodiment of the present disclosure includes a base and a coating film located on the base. The coated tool includes a first surface, a second surface adjacent to the first surface, and a cutting edge located on at least a part of a ridge part of the first surface and the second surface. The coating film includes an AlTiN film including Ti, Al and N. A first Al ratio and a second Al ratio are 0.7 or more. The first Al ratio is Al/(Al+Ti) at a point located 0.1 mm away from the cutting edge, and the second Al ratio is Al/(Al+Ti) at a point located 0.2 mm away from the cutting edge in the first surface. The second Al ratio is larger than the first Al ratio.

DETAILED DESCRIPTION

<Coated Tools>

Figure 1:
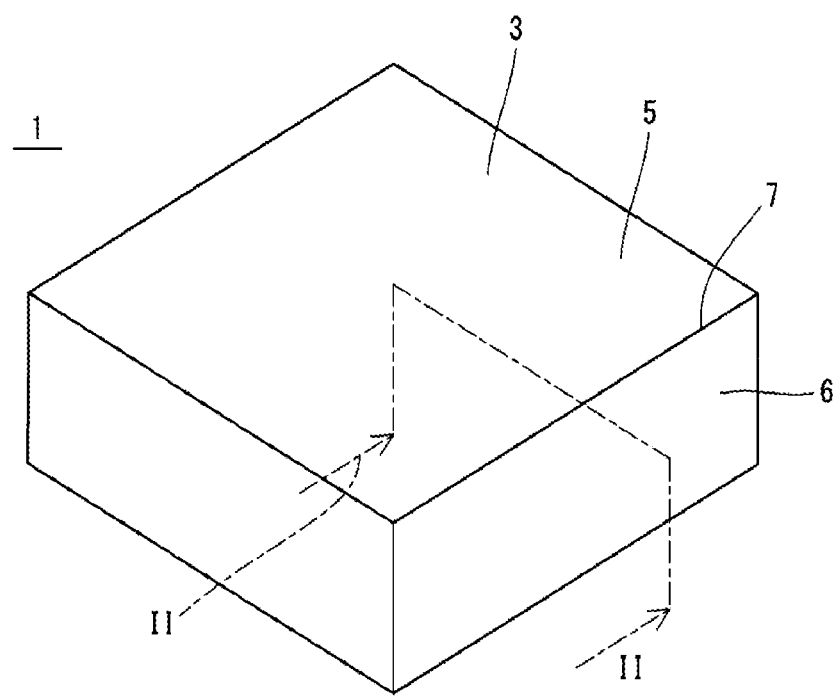
FIG. 1 is a perspective view illustrating a coated tool in a non-limiting embodiment of the present disclosure.

Coated tools in non-limiting embodiments of the present disclosure are described in detail below with reference to the drawings. For the sake of convenience, the drawings referred to in the following illustrate, in simplified form, only configurations necessary for describing the embodiments. The coated tools may therefore include any arbitrary configuration not illustrated in the drawings referred to. Dimensions of the configurations in each of the drawings faithfully represent neither dimensions of actual configurations nor dimensional ratios of these configurations.

Figure 2:
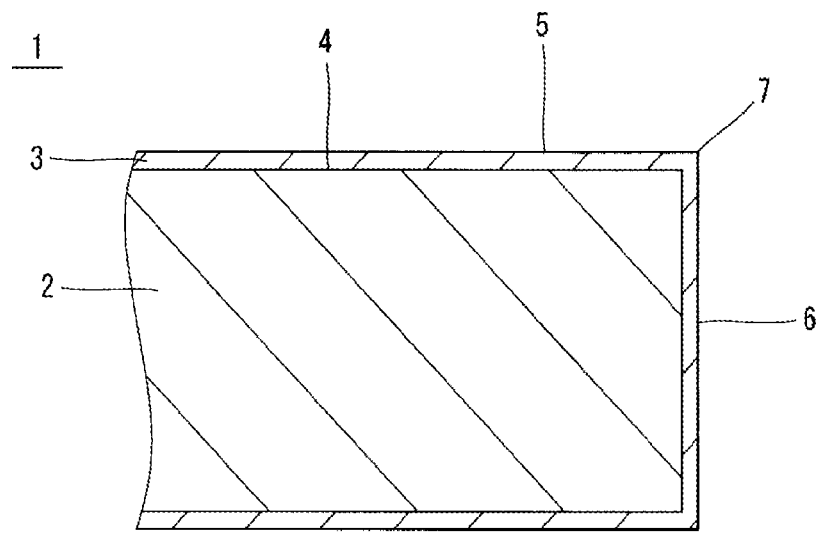
FIG. 2 is an enlarged view of a cross section taken along the line II-II in the coated tool illustrated in FIG. 1.
Figure 3:
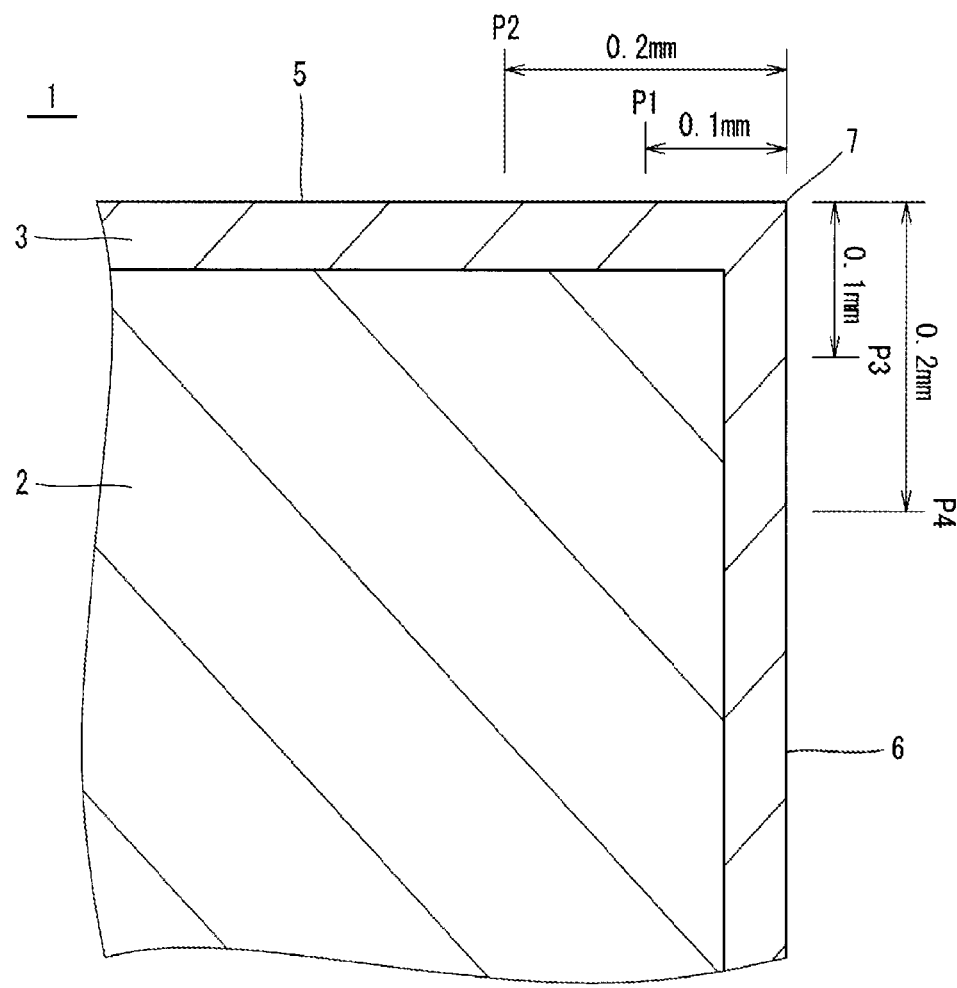
FIG. 3 is an enlarged view of circumferences of a cutting edge in the coated tool illustrated in FIG. 2.

The coated tool 1 illustrated in FIGS. 1 to 3 is a cutting tool (cutting insert) for use in a cutting process of a workpiece. The coated tool 1 is applicable to, besides cutting tools, wear resistant parts such as sliding parts and metal molds, digging tools, tools such as blades, and impact resistant parts. Applications of the coated tool 1 are not limited to those illustrated above.

The coated tool 1 may include a base 2 and a coating film 3 located on the base 2.

Examples of material of the base 2 may include hard alloys, ceramics and metals. Examples of the hard alloys may include cemented carbides in which a hard phase composed of WC (tungsten carbide) and, if desired, at least one kind selected from the group consisting of carbide, nitride and carbonitride of group 4, group 5 and group 6 metals in the periodic table other than WC is bonded by a binding phase composed of an iron group metal such as Co (cobalt) or Ni(nickel). Other hard alloys may be Ti-based cermets. The ceramics may be, for example, $Si_3N_4$ (silicon nitride), $Al_2O_3$ (aluminum oxide), diamond and cBN (cubic boron nitride). The metals may be, for example, carbon steel, high-speed steel and alloy steel. The material of the base 2 is however not limited to those illustrated above.

The coating film 3 may cover a whole or a part of the surface 4 of the base 2. If the coating film 3 covers only a part of the surface 4 of the base 2, it can be said that the coating film 3 is located on at least a part on the base 2.

The coating film 3 illustrated in FIGS. 1 to 3 may be deposed by chemical vapor deposition (CVD) method. In other words, the coating film 3 illustrated in FIGS. 1 to 3 may be a CVD film.

A thickness of the coating film 3 may be set to, for example, 1-20 μm. The thickness of the coating film 3 is measurable by, for example, cross-section measurement with a Scanning Electron Microscope (SEM) or the like.

The coated tool 1 may include a first surface 5 (upper surface), a second surface 6 (lateral surface) adjacent to the first surface 5, and a cutting edge 7 located on at least a part of a ridge part between the first surface 5 and the second surface 6. The cutting edge 7 may be located on a part or a whole of the ridge part.

The first surface 5 may be a rake surface. A whole or a part of the first surface 5 may be the rake surface. For example, a region extended along the cutting edge 7 in the first surface 5 may be the rake surface.

The second surface 6 may be a flank surface. A whole or a part of the second surface 6 may be the flank surface. For example, a region extended along the cutting edge 7 in the second surface 6 may be the flank surface.

Although the coated tool 1 illustrated in FIG. 1 has a quadrangular plate shape, the shape of the coated tool 1 is not limited thereto. For example, the first surface 5 illustrated in FIG. 1 has a quadrangular shape, but there is no problem if the first surface 5 has a triangular or hexagonal shape instead of the quadrangular shape.

Dimensions of the coated tool 1 are not particularly limited. For example, a length of one side of the first surface 5 in the coated tool 1 illustrated in FIG. 1 is settable to approximately 1-20 mm. A height from the first surface 5 to a surface (lower surface) located on a side opposite to the first surface 5 is settable to approximately 5-20 mm.

The coating film 3 may include an AlTiN (aluminum titanium nitride) film including Ti (titanium), Al (aluminum) and N (nitrogen). As in a non-limiting embodiment illustrated in FIG. 3, Al/(Al+Ti) at a point P1 located 0.1 mm away from the cutting edge 7 is a first Al ratio, and Al/(Al+Ti) at a point P2 located 0.2 mm away from the cutting edge 7 is a second Al ratio in the first surface 5 in the coating film 3. The first Al ratio and the second Al ratio may be 0.7 or more. The second Al ratio may be larger than the first Al ratio.

With the above configuration, excellent toughness is achievable because of a relatively low Al content in a region at the point P1 near the cutting edge 7. High hardness and enhanced oxidation resistance are achievable because of a relatively high Al content in a region at the point P2 further away from the cutting edge 7 than the point P1. Consequently, the coated tool 1 having these configurations has a long life.

Al/(Al+Ti) at a point P3 located 0.1 mm away from the cutting edge 7 is a third Al ratio, and Al/(Al+Ti) at a point P4 located 0.2 mm away from the cutting edge 7 is a fourth Al ratio in the second surface 6. The third Al ratio and the fourth Al ratio may be 0.7 or more. The fourth Al ratio may be larger than the third Al ratio. If satisfying these configurations, the coated tool 1 has a longer life because in addition to the first surface 5, the second surface 6 has the same effect as the first surface 5.

The first Al ratio may be larger than the third Al ratio. The second Al ratio may be larger than the fourth Al ratio. In other words, it may be the second Al ratio>the first Al ratio>the fourth Al ratio>the third Al ratio. If satisfying these configurations, it makes it easier to obtain effects of reducing both crater wear and flank wear.

The first Al ratio and the second Al ratio may be 0.7-0.95. The third Al ratio and the fourth Al ratio may be 0.7-0.95. If the first Al ratio and the second Al ratio is 0.85-0.95 and the third Al ratio and the fourth Al ratio is 0.85-0.95, the coated tool 1 has a longer life. The first to fourth Al ratios may be a content ratio of Al to a sum of Al and Ti in terms of atomic ratio. The first to fourth Al ratios are measurable by, for example, energy dispersive X-ray spectroscopy (EDS) analysis method.

A thickness of the AlTiN film may be set to, for example, 1-20 μm. The coating film 3 may include other film besides the AlTiN film.

<Method for Manufacturing Coated Tool>

A method for manufacturing a coated tool in a non-limiting embodiment of the present disclosure is described below by exemplifying an embodiment of manufacturing the coated tool 1.

A description is made by exemplifying an embodiment where the base 2 composed of a hard alloy is manufactured as the base 2. Firstly, a mixture may be prepared by suitably adding metal powder, carbon powder or the like to an inorganic powder, such as metal carbide, nitride, carbonitride and oxide which are capable of forming the base 2 by sintering, and then by mixing them together. With a known molding method, such as press molding, casting molding, extrusion molding or cold isostatic pressing, the mixture may be molded into a predetermined tool shape. Subsequently, the base 2 composed of the hard alloy may be obtained by sintering an obtained molded body in a vacuum or a non-oxidizing atmosphere. Thereafter, a surface 4 of the base 2 may be subjected to polishing process and honing process.

Subsequently, the coated tool 1 may be obtained by depositing a coating film 3 on the surface 4 of the obtained base 2 by CVD method. Deposition conditions for the coating film 3 including an AlTiN film are for example as follows. A composition of a mixed gas is 0.05-0.5 vol % of $TiCl_4$(titanium tetrachloride) gas, 0.2-2.0 vol % of $AlCl_3$ (aluminum trichloride) gas, 3-10 vol % of $NH_3$(ammonia) gas, and the rest, namely, $H_2$(hydrogen) gas. A deposition temperature is 700-900° C., and a pressure is 1-10 kPa.

A difference in composition can be generated in the coating film 3 (AlTiN film) by setting a flow velocity of the mixed gas so as to be higher than a general flow velocity during the deposition. This makes it easier to deposit the coating film 3 having the above configuration. For example, the flow velocity of the mixed gas during the deposition may be set to 5-50 m/s.

A region including the cutting edge 7 in the obtained coated tool 1 may be subjected to a polishing process. Consequently, the region including the cutting edge 7 becomes smooth, and the workpiece is therefore less susceptible to welding, thereby improving the fracture resistance of the cutting edge 7.

The present disclosure is described in detail below by illustrating examples, however, the present disclosure is not limited to the following examples.

EXAMPLES

[Samples Nos. 1 to 7]

Firstly, a base was manufactured. Specifically, 6 mass % of metal Co powder having a mean particle diameter of 1.5 μm, 2.0 mass % of TiC (titanium carbide) powder, 0.2 mass % of $Cr_3C_2$ (chromium carbide) powder were added to WC powder having a mean particle diameter of 1.2 μm, and these were mixed together in their respective proportions. A mixture thus obtained was molded into a cutting tool shape (SEEN1203AFTN) by press molding. An obtained molded body was subjected to debinding process and then sintering at 1400° C. in a vacuum of 0.5-100 Pa for one hour, thereby manufacturing a base composed of cemented carbide. Thereafter, a rake surface (first surface) side of the manufactured base was subjected to cutting edge processing (round honing) by brushing process.

Subsequently, a coating film (AlTiN film) having a thickness of 1-20 μm was deposited on the obtained base by CVD method, thereby obtaining a coated tool presented in Table 1. Deposition conditions were presented in Table 1. A thickness of the coating film was a value obtained by cross-section measurement with an SEM. A flow velocity is found from $V=(S/L)\times(T'/P')$, in which V is a flow velocity, S is a cross-sectional area ($m^2$) of a furnace, L is a flow rate, T' is a film forming temperature (K)/300 K, and P' is a furnace pressure (kPa)/101.325 kPa. The cross-sectional area of the furnace is obtainable from a cross-sectional area of a surface vertical to a gas injection port. If the cross-sectional area of the furnace changes depending on position, a maximum cross-sectional area may be regarded as the cross-sectional area of the furnace.

TABLE 1

| Sample No. | Composition of mixed gas | | | | Deposition temperature (° C.) | Pressure (kPa) | Flow velocity (m/s) |
| --- | --- | --- | --- | --- | --- | --- | --- |
| | $TiCl_4$ (Vol %) | $AlCl_3$ (Vol %) | $NH_3$ (Vol %) | $H_2$ (Vol %) | | | |
| 1 | 0.1 | 1 | 7 | rest | 800 | 5 | 5 |
| 2 | 0.3 | 1.2 | 8 | rest | 800 | 5 | 5 |

TABLE 1-continued

| Sample No. | Composition of mixed gas | | | | Deposition temperature (°C.) | Pressure (kPa) | Flow velocity (m/s) |
|---|---|---|---|---|---|---|---|
| | TiCl$_4$ (Vol %) | AlCl$_3$ (Vol %) | NH$_3$ (Vol %) | H$_2$ (Vol %) | | | |
| 3 | 0.45 | 1.1 | 7.5 | rest | 800 | 5 | 5 |
| 4 | 0.4 | 1.6 | 5 | rest | 800 | 5 | 20 |
| 5 | 0.35 | 1.5 | 4 | rest | 800 | 5 | 4 |
| 6 | 0.6 | 0.85 | 6 | rest | 800 | 5 | 60 |
| 7 | 0.7 | 1.6 | 5 | rest | 800 | 5 | 60 |

<Evaluation>

First to fourth Al ratios were measured and an intermittent cutting test was conducted on the obtained coated tools. Individual measurement methods are as follows, and results are presented in Table 2.

(First to Fourth Al Ratios)

These ratios were measured by EDS analysis method.

(Intermittent Cutting Test: Dry Milling, Center Cutting Process)

Workpiece: Chromium molybdenum steel (SCM440)
Tool Shape: SEEN1203AFTN
  Cutting Speed: 300 m/min
  Feed rate: 0.20 mm/rev
  Depth of Cut: 2.0 mm
  Evaluation Item: Time (cutting time) until a fracture occurs

TABLE 2

| Sample No. | First Al ratio | Second Al ratio | Third Al ratio | Fourth Al ratio | Intermittent cutting test Cutting time (min.) |
|---|---|---|---|---|---|
| 1 | 0.9 | 0.92 | 0.86 | 0.88 | 90 |
| 2 | 0.8 | 0.84 | 0.79 | 0.81 | 80 |
| 3 | 0.72 | 0.74 | 0.7 | 0.72 | 70 |
| 4 | 0.8 | 0.82 | 0.77 | 0.79 | 75 |
| 5 | 0.82 | 0.82 | 0.82 | 0.82 | 30 |
| 6 | 0.6 | 0.6 | 0.6 | 0.6 | 10 |
| 7 | 0.8 | 0.8 | 0.8 | 0.8 | 20 |

As presented in Table 2, Samples Nos. 1-4 have a long life because the first Al ratio and the second Al ratio are 0.7 or more, and the second Al ratio is larger than the first Al ratio. Samples Nos. 5 to 7 have a short life because the first Al ratio and the second Al ratio are not 0.7 or more, or the second Al ratio is not larger than the first Al ratio.

Although the non-limiting embodiments in the present disclosure have been illustrated and described above, the present disclosure is not limited to the foregoing non-limiting embodiments. It is, of course, possible to make any optional ones insofar as they do not depart from the gist of the present disclosure.

DESCRIPTION OF THE REFERENCE NUMERALS 1 coated tool
2 base
3 coating film
4 surface
5 first surface
6 second surface
7 cutting edge
P1, P2, P3, P4 position

What is claimed is:

1. A coated tool, comprising a base and a coating film located on the base,
  the coated tool comprising:
    a first surface,
    a second surface adjacent to the first surface, and
    a cutting edge located on at least a part of a ridge part of the first surface and the second surface,
  wherein
  the coating film comprises an AlTiN film comprising Ti, Al, and N;
  a first Al ratio and a second Al ratio are 0.7 or more, in which the first Al ratio is Al/(Al+Ti) at a point located 0.1 mm away from the cutting edge, and the second Al ratio is Al/(Al+Ti) at a point located 0.2 mm away from the cutting edge in the first surface; and
  the second Al ratio is greater than the first Al ratio,
  a third Al ratio and a fourth Al ratio are 0.7 or more, in which the third Al ratio is Al/(Al+Ti) at a point located 0.1 mm away from the cutting edge, and the fourth Al ratio is Al/(Al+Ti) at a point located 0.2 mm away from the cutting edge in the second surface, and
  the fourth Al ratio is greater than the third Al ratio.

2. The coated tool according to claim 1, wherein
  the first Al ratio is greater than the third Al ratio, and the second Al ratio is greater than the fourth Al ratio.

3. The coated tool according to claim 1, wherein
  the first surface is a rake surface, and the second surface is a flank surface.

* * * * *

UNITED STATES PATENT AND TRADEMARK OFFICE
CERTIFICATE OF CORRECTION

| | | |
|---|---|---|
| PATENT NO. | : 12,427,581 B2 | Page 1 of 1 |
| APPLICATION NO. | : 17/793675 | |
| DATED | : September 30, 2025 | |
| INVENTOR(S) | : Takahito Tanibuchi et al. | |

It is certified that error appears in the above-identified patent and that said Letters Patent is hereby corrected as shown below:

In the Specification

Column 2, Line 65 (last line): change "Sin" to --5 in--

Signed and Sealed this
Ninth Day of December, 2025

John A. Squires
*Director of the United States Patent and Trademark Office*